United States Patent
Lee et al.

(10) Patent No.: US 7,444,827 B2
(45) Date of Patent: Nov. 4, 2008

(54) COOLING DEVICE FOR MULTIPLE HEAT-GENERATING COMPONENTS

(75) Inventors: Chih-Peng Lee, Guangdong (CN); Tay-Jian Liu, Guangdong (CN)

(73) Assignee: Foxconn Technology Co., Ltd, Tu-Cheng, Taipei Hsien (TW)

( * ) Notice: Subject to any disclaimer, the term of this patent is extended or adjusted under 35 U.S.C. 154(b) by 291 days.

(21) Appl. No.: 11/307,009

(22) Filed: Jan. 19, 2006

(65) Prior Publication Data
US 2006/0196207 A1  Sep. 7, 2006

(30) Foreign Application Priority Data
Feb. 25, 2005  (TW) .............................. 94105767 A

(51) Int. Cl.
*F25D 23/12*  (2006.01)
(52) U.S. Cl. ................... 62/259.2; 62/515; 165/104.33; 361/688
(58) Field of Classification Search ................... 62/184, 62/259.1, 259.2, 183, 177, 178, 180, 181, 62/276, 515; 361/687, 688, 689, 699; 165/80.2, 165/80.4, 104.33
See application file for complete search history.

(56) References Cited

U.S. PATENT DOCUMENTS

| | | | | |
|---|---|---|---|---|
| 2,741,095 A | * | 4/1956 | Jacobs | .................... 62/152 |
| 5,297,005 A | * | 3/1994 | Gourdine | .................... 361/697 |
| 5,912,802 A | | 6/1999 | Nelson | |
| 6,055,854 A | * | 5/2000 | Chen | ........................ 73/146.8 |
| 6,166,907 A | * | 12/2000 | Chien | ........................ 361/699 |
| 6,351,965 B1 | * | 3/2002 | Toyama | ..................... 62/324.6 |
| 6,526,768 B2 | * | 3/2003 | Wall et al. | ..................... 62/184 |
| 7,252,139 B2 | * | 8/2007 | Novotny et al. | ............ 165/80.2 |
| 2003/0005711 A1 | * | 1/2003 | Goth et al. | .................. 62/176.1 |
| 2003/0019234 A1 | * | 1/2003 | Wayburn et al. | ........... 62/259.2 |

FOREIGN PATENT DOCUMENTS

| | | |
|---|---|---|
| CN | 1266978 A | 9/2000 |
| CN | 2650207 Y | 10/2004 |
| CN | 2664195 Y | 12/2004 |
| DE | 10344699 A1 * | 4/2004 |

* cited by examiner

*Primary Examiner*—Mohammad M Ali
(74) *Attorney, Agent, or Firm*—Winston Hsu

(57) ABSTRACT

A cooling device for multiple heat generating components is disclosed, which includes an evaporator (1), a condenser (3), a vapor conduit (6), a liquid conduit (5) and a diffluent member (19). The evaporator includes at least two cooling members (15) for thermally contacting the multiple heat-generating components, respectively. Each of the cooling members defines therein a fluid flow channel (22) for passage of a refrigerant fluid. The vapor and liquid conduits each are connected between the cooling member and the condenser. The diffluent member is in fluid communication with the liquid conduit and the fluid flow channel of each of the cooling members. The diffluent member functions to evenly distribute the refrigerant fluid into the cooling members so as to maintain the same heat removal capacity for the cooling members.

19 Claims, 9 Drawing Sheets

COOLING DEVICE FOR MULTIPLE HEAT-GENERATING COMPONENTS

FIELD OF THE INVENTION

The present invention relates generally to an apparatus for transfer or dissipation of heat from heat-generating components, and more particularly to a cooling device for dissipating heat simultaneously from multiple heat-generating components.

DESCRIPTION OF RELATED ART

As progress continues developing in electronic industries, electronic components such as integrated circuit chips including central processing units (CPUs) of computers are made to have more powerful functions to enable them to be capable of processing data at a higher speed. However, the amount of heat generated by these electronic components during their normal operations is also commensurately increased, which in turn will adversely affect their workability and stability. If the generated heat is not timely removed away from these electronic components, they will become overheated and finally damaged. Thus, cooling devices such as heat sinks plus cooling fans are commonly required to remove heat from these electronic components.

Currently, in order to maintain a high speed of data process and meanwhile solve the overheating problem, more than one CPU is generally provided in a single computer, especially in a server computer, so as to reduce the heat load placed on a single CPU. In this situation, a cooling device that is capable of removing heat simultaneously from multiple heat-generating components is generally required to dissipate the heat generated by the CPUs. To effectively take the heat away from each of the CPUs, the cooling device is also required to maintain the same heat removal capacity for each of the CPUs so as to prevent any particular one of the CPUs from becoming overheated due to an insufficient cooling.

FIG. 8 illustrates a conventional cooling device which includes two heat sinks 100 attached to two CPUs 200, respectively, for cooling the CPUs 200. An airflow generated by a blower (not shown) is guided via a first air duct 300 towards the first heat sink 100 mounted to one of the CPUs 200. After flowing through the first heat sink 100, the airflow is guided via a second air duct 400 to the second heat sink 100 mounted to the other of the CPUs 200. Thus, the heat generated by the CPUs 200 is respectively taken away by the heat sinks 100. However, these heat sinks 100 are generally made of metal material such as aluminum and are therefore incapable of effectively removing the heat of the CPUs 200 due to their low heat removal capacity. In addition, the cooling device does not maintain the same heat removal capacity for each of the CPUs 200. After passing through the first heat sink 100, the airflow has become hot and therefore cannot effectively take the heat away from the second heat sink 100.

It is well known that when electronic components are cooled down to below ambient temperature, their operating efficiency will be greatly improved. Refrigeration systems are such cooling device that can be used to cool electronic components to temperatures below ambient or even below zero centigrade degree. A refrigeration system generally includes an evaporator, a condenser and tubes connecting the evaporator and the condenser. The refrigeration system employs a refrigerant fluid circulating therethrough to thereby take heat away from the electronic components. As illustrated in FIG. 9, the evaporator 500 is received in a casing 600 and is attached to the CPU 800 for removing heat from the CPU 800.

An O-ring 700 is attached to a circumferential periphery of the evaporator 500 to maintain the evaporator 500 in place. However, in assembly, a bottom surface of the evaporator 500 is prone to disengage from a top surface of the CPU 800 since no effective mechanism is provided to maintain the evaporator 500 in a horizontal orientation so that it can have an intimate engagement with the CPU 800. As a result, the evaporator 500 may incline to one side thereof, as exaggeratedly shown in FIG. 9, which greatly impair the heat dissipating effect thereof. Furthermore, since the evaporator 500 and the CPU 800 are located at the same housing defined by the casing 600, moisture generated by the evaporator 500 and accumulated on an outer surface thereof during its cooling operation may drop directly on a motherboard on which the CPU 800 and other electronic components are mounted. Such moisture will affect the CPU and the other electronic components, which are sensitive to the moisture.

Therefore, it is desirable to provide a cooling device which overcomes the foregoing disadvantages.

SUMMARY OF INVENTION

The present invention relates to a cooling device for removing heat from multiple heat-generating components. In one embodiment, the cooling device includes an evaporator, a condenser, a vapor conduit, a liquid conduit and a diffluent member. The evaporator includes at least two cooling members. The cooling members are adapted for thermally contacting the multiple heat-generating components, respectively. Each of the cooling members defines therein a fluid flow channel for passage of a refrigerant fluid. The refrigerant fluid is capable of turning into vapor in the cooling member upon receiving the heat from the heat-generating components. The vapor and liquid conduits each are connected between the cooling member and the condenser. The vapor generated in the evaporator is capable of being transferred via the vapor conduit to the condenser and turning into condensate in the condenser upon releasing the heat. The condensate is capable of being transferred via the liquid conduit to the cooling members. The diffluent member is in fluid communication with the liquid conduit and the fluid flow channel of each of the cooling members. The diffluent member functions to evenly distribute the condensate into the cooling members so as to maintain the same heat removal capacity for the cooling members and to thus prevent any particular one of the heat-generating components from becoming overheated due to an insufficient supply of the refrigerant fluid.

Other advantages and novel features of the present invention will become more apparent from the following detailed description of preferred embodiment when taken in conjunction with the accompanying drawings, in which:

DETAILED DESCRIPTION

Figure 1:
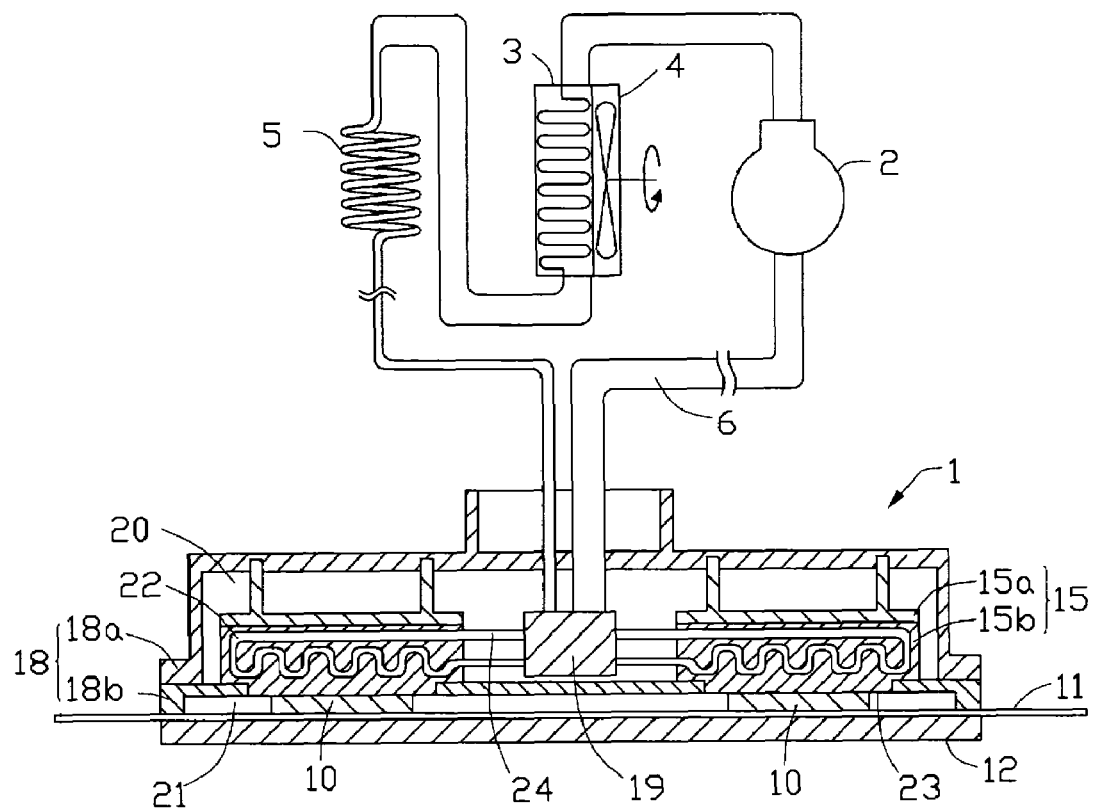
FIG. 1 is a diagrammatic, partially cross-sectional view of a cooling device in accordance with a first embodiment of the present invention.

FIG. 1 is a diagrammatic representation of a cooling device for removing heat simultaneously from multiple heat-generating components in accordance with a first embodiment of the present invention. Typically, the heat-generating components are two CPUs 10 mounted on a motherboard 11 and spaced from each other. The cooling device includes an evaporator 1, a vapor conduit 6, a compressor 2, a condenser 3 and a liquid conduit 5. These components are connected together in series to form a refrigeration system.

Figure 2:
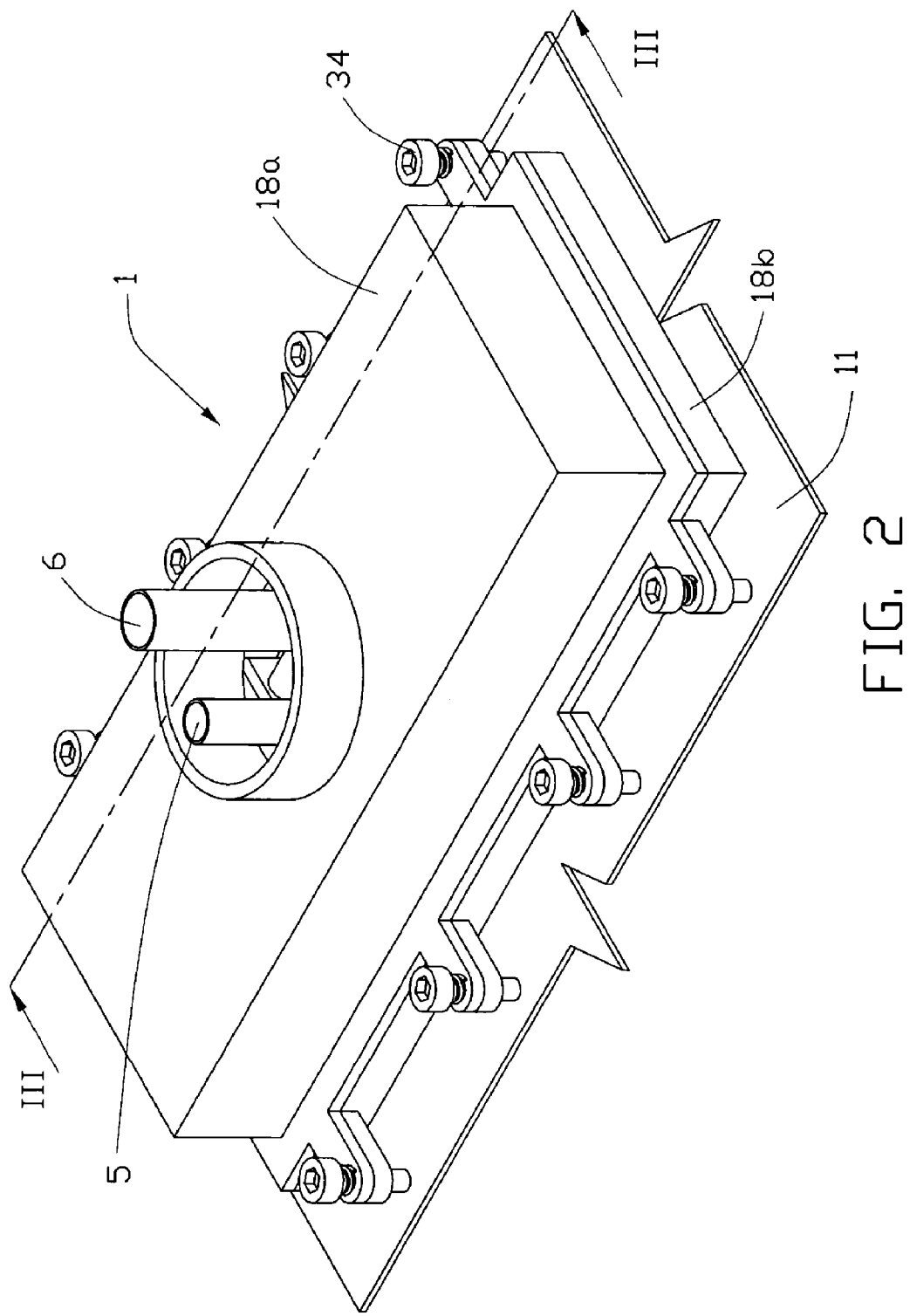
FIG. 2 is an isometric view of an evaporator of the cooling device of FIG. 1.

The evaporator 1 contains therein two discrete cooling members 15. The cooling members 15 are respectively secured to the CPUs 10 by a clamping mechanism 18 which includes a top cover 18a and a bottom partition plate 18b located below the top cover 18a. The top cover 18a and the partition plate 18b are mounted to the motherboard 11 by a plurality of screws 34 extending through locking ears (not labeled) formed on the clamping mechanism 18, as shown in FIG. 2. Accordingly, an interior of the evaporator 1 is divided into two chambers, i.e., a first chamber 20 between the top cover 18a and the bottom partition plate 18b and a second chamber 21 between the partition plate 18b and the motherboard 11, both of which are hermetically sealed from an ambient environment and from each other. The cooling members 15 and the CPUs 10 are respectively received in the first and second chambers 20, 21 and are therefore kept heat-isolated from the ambient environment. A diffluent member 19, locating between the two cooling members 15, is also contained in the first chamber 20 and is in fluid communication with the vapor and liquid conduits 6, 5. A back plate 12 is provided under the motherboard 11 opposite to the clamping mechanism 18 to hermetically seal the motherboard 11 within the second chamber 21.

In the present cooling device, each of the cooling members 15 includes an upper portion 15a and a lower portion 15b located above and connected to the lower portion 15b. The lower portion 15b has a cooling surface 23 in thermal contact with a corresponding CPU 10 for receiving the heat generated by the CPU 10. The lower portion 15b defines therein a fluid flow channel 22 for passage of a refrigerant fluid to thereby take the heat away from the corresponding CPU 10. The fluid flow channel 22 is in fluid communication with the diffluent member 19. The refrigeration system employs the refrigerant fluid circulated so as to alternatively absorb and release thermal energy. Specifically, the refrigerant fluid absorbs excessive thermal energy from the CPUs 10 as it flows through the fluid flow channel 22 defined in each of the cooling members 15 and evaporates into vapor. The generated low pressure vapor exits the cooling members 15 and is fed, along the vapor conduit 6, to the compressor 2 for being compressed to a high pressure vapor. The resulting high pressure vapor is then fed to the condenser 3 where the thermal energy carried by the vapor is released and where the vapor is condensed into condensate. The condensate then returns back to the cooling members 15 via the liquid conduit 5, thus forming a heat transfer loop and effectively taking the excessive heat away from the CPUs 10. In order to bring the condensate rapidly to the cooling members 15, the liquid conduit 5 is preferably in the form of a capillary tube. In addition, a cooling fan 4 is attached to the condenser 3 to produce a forced airflow towards the condenser 3 for achieving a better heat exchange effect between the high pressure vapor and the ambient environment.

Figure 3:
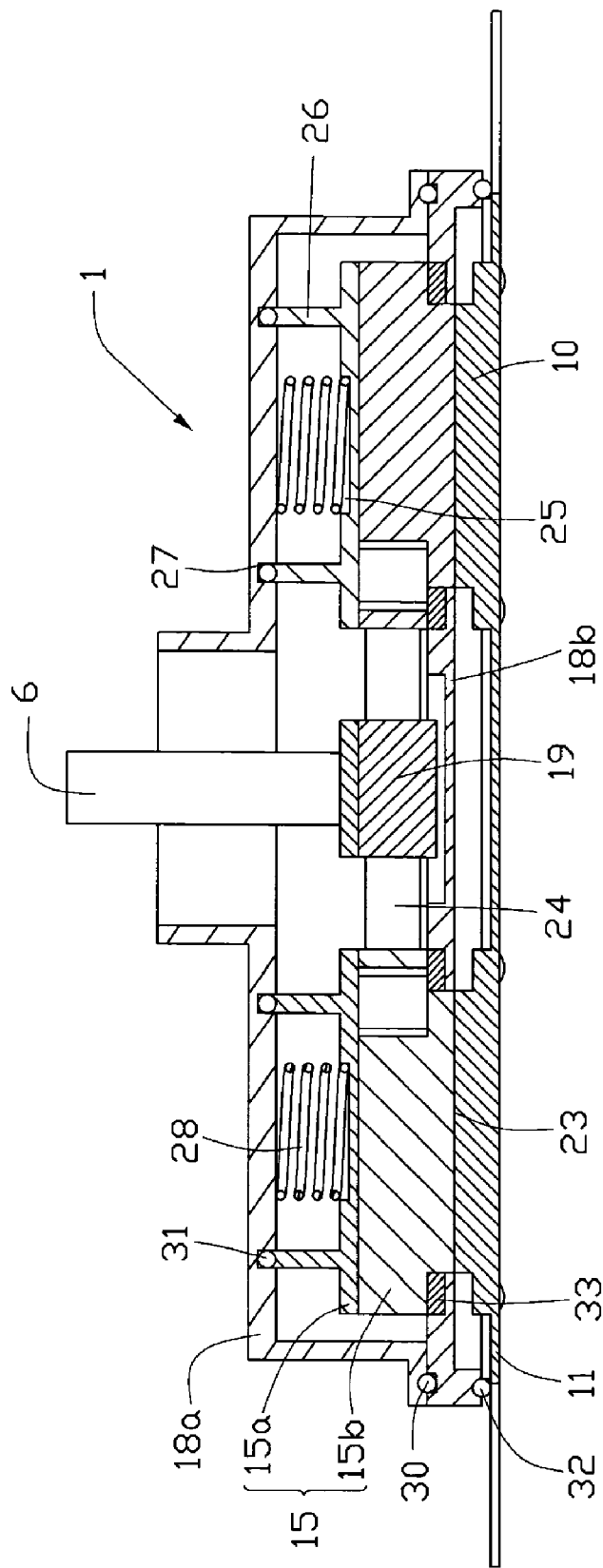
FIG. 3 is a cross-sectional view of the evaporator of FIG. 2, taken along line III-III thereof.
Figure 4:
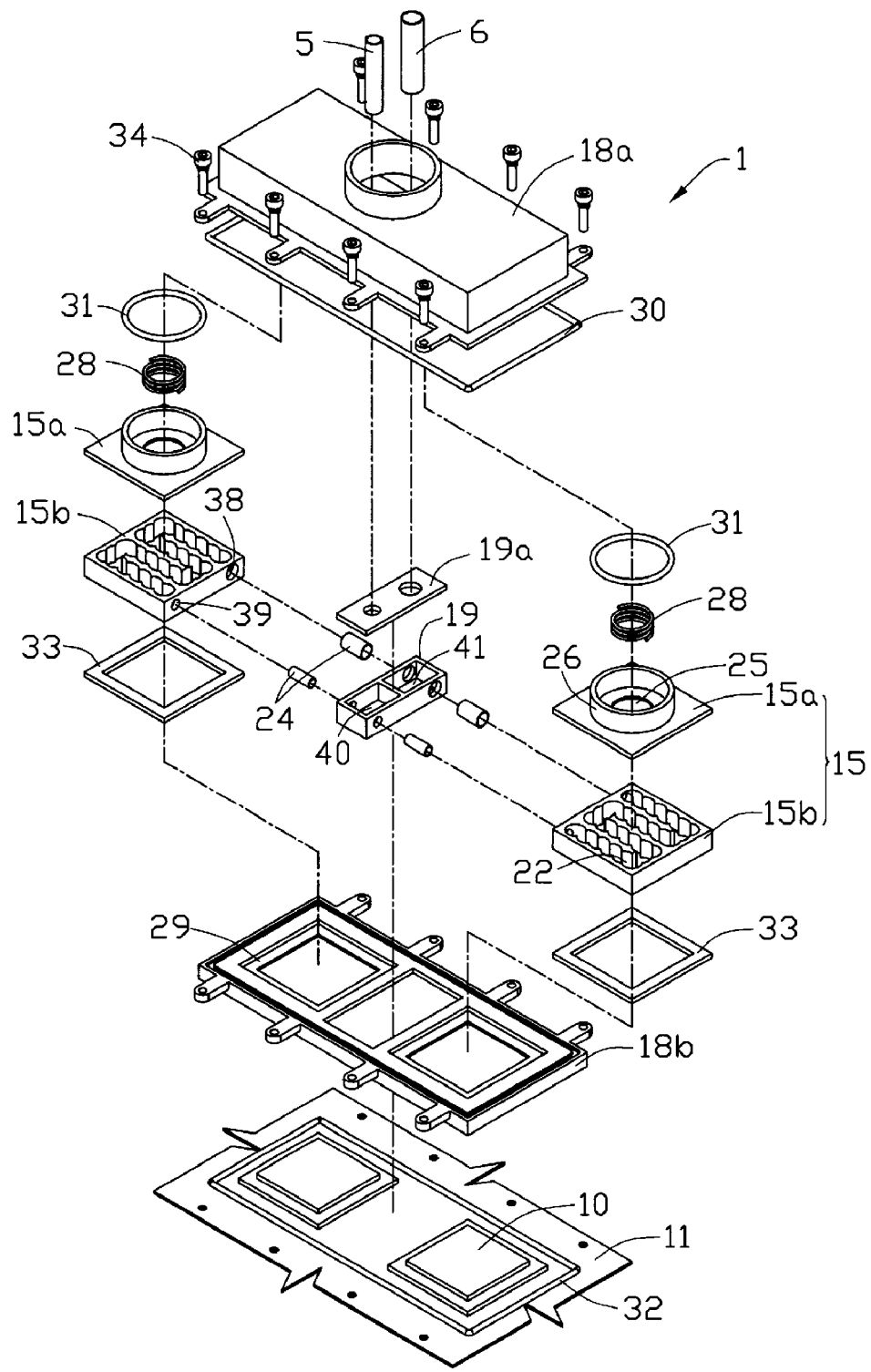
FIG. 4 is an exploded, isometric view of the evaporator of FIG. 2.

Referring now to FIGS. 2-4, certain additional details regarding the evaporator 1 will be apparent from these drawings. The upper portion 15a of each cooling member 15 centrally defines a recess 25 at a top surface thereof. An elastic member such as a helical spring 28 is located between the top cover 18a of the clamping mechanism 18 and the upper portion 15a. The helical spring 28 is compressed and a bottom end thereof is positioned in the recess 25 of the upper portion 15a. Further, the upper portion 15a has an annular abutting wall 26 integrally extending upwardly from its top surface. The abutting wall 26 surrounds the recess 25. Correspondingly, the top cover 18a of the clamping mechanism 18 defines at a surface thereof an annular receiving groove 27 for receiving a top portion of the abutting wall 26. Preferably, a resilient gasket 31 is placed in the receiving groove 27 and is deformable under the engagement of the abutting wall 26 in the receiving groove 27. The abutting wall 26 and the helical spring 28 cooperatively produce a downward pressing force evenly and uniformly urging each cooling member 15 towards the corresponding CPU 10, and meanwhile maintain the cooling member 15 in an intimate contact with the CPU 10.

The diffluent member 19 has a box-like structure and defines therein a first housing 40 and a second housing 41. A top plate 19a of the diffluent member 19 defines therein a pair of openings (not labeled) for extension of the liquid and vapor conduits 5, 6 respectively into the first and second housings 40, 41. Meanwhile, the first and second housings 40, 41 are in fluid communication with the fluid flow channel 22 of each cooling member 15 via a pair of connecting tubes 24. The generated vapor in the fluid flow channel 22 escapes the cooling member 15 from an outlet 38 of the fluid flow channel 22 and enters into the second housing 41 of the diffluent member 19 via one of the connecting tubes 24. The vapor then goes, via the vapor conduit 6, into the condenser 3 for releasing the heat carried thereby. On the other hand, the condensate resulting from the vapor goes into the first housing 40 of the diffluent member 19 via the liquid conduit 5. Then, the condensate in the first housing 40 is evenly divided into two currents of condensate and each current of the condensate returns back to the fluid flow channel 22 of each cooling member 15 from an inlet 39 of the fluid flow channel 22 via the other of the connecting tubes 24. Thus, the diffluent member 19 functions to evenly distribute the condensate into the two cooling members 15 so as to maintain the same heat removal capacity for the cooling members 15 and to prevent any particular one of the CPUs 10 from becoming overheated due to an insufficient supply of the condensate.

The partition plate 18b of the clamping mechanism 18 defines therein two through holes (not labeled) for extension of the two cooling members 15 respectively to allow the cooling surface 23 of each of the cooling members 15 to contact with the corresponding CPU 10. Besides, in the partition plate 18b, a rectangular recess 29 is formed surrounding each of the through holes for fittingly receiving of and providing support for an outer circumferential portion of each of the cooling members 15. Preferably, a rectangular, resilient seal 33 is disposed in the rectangular recess 29 for providing a resiliency and hermetical seal. As a result, a substantial part of each of the cooling members 15 is located in the first chamber 20 and is isolated from the second chamber 21 of the evaporator 1. Thus, the moisture generated by and accumulating around the cooling members 15 is prevented from penetrating into the second chamber 21 to cause an undesirable moisture problem on the motherboard 11. Also, a heating device (not shown) may be provided in or attached to the back plate 12 to actively prevent the formation of the moisture on the motherboard 11. Furthermore, two resilient seals 30, 32 are provided between the top cover 18a and the bottom partition plate 18b of the clamping mechanism 18, and between the partition plate 18b and the motherboard 11, respectively, in order to hermetically seal the first and second chambers 20, 21.

Figure 5:
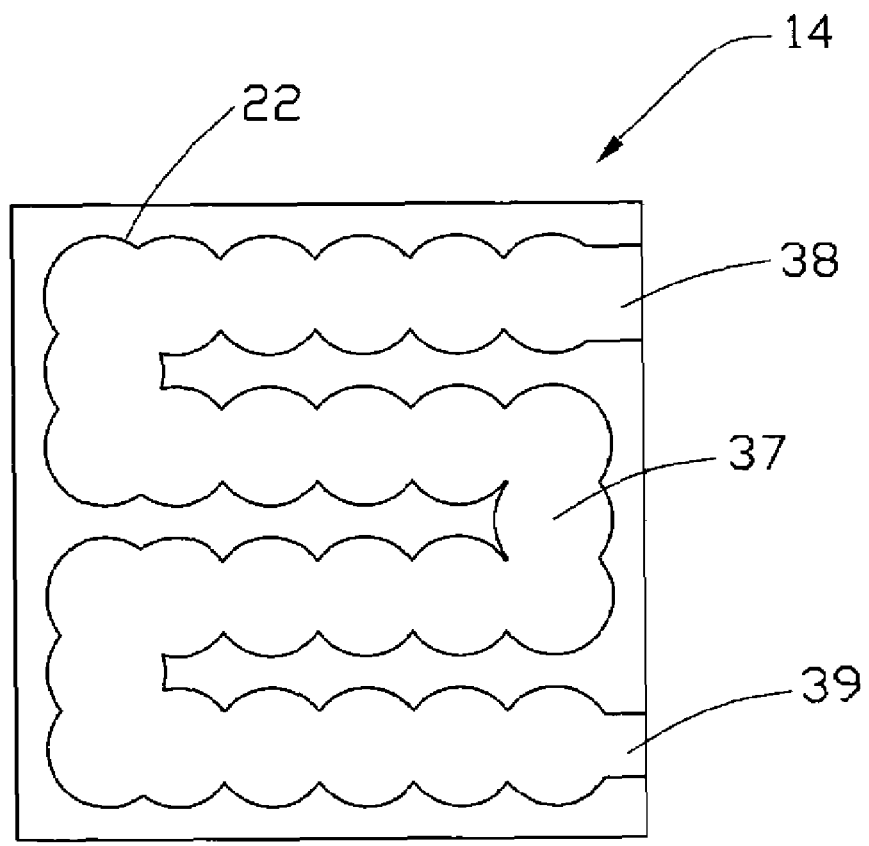
FIG. 5 is a top plan view of a lower portion of a cooling member of the evaporator of FIG. 2.

The fluid flow channel 22 of each cooling member 15 has a corrugated inner surface, as particularly shown in FIG. 5. The fluid flow channel 22 is typically formed by milling a plurality of round holes 37 interconnected together in the lower portion 15b of the cooling member 15. This corrugated configuration of the fluid flow channel 22 is capable of increasing the contact surface between the cooling member 15 and the refrigerant fluid flowing through the fluid flow channel 22. On the other hand, the corrugated inner surface of the fluid flow channel 22 is also advantageous in producing vortexes as the refrigerant fluid flows through the fluid flow channel 22, to thereby increase the heat transfer effect for the evaporator 1. It should be recognized that the holes 37 formed in the cooling member 15 may also take other shapes. The two-portion design of the cooling member 15 facilitates the manufacture of the fluid flow channel 22 and allows the upper and lower portions 15a, 15b to be constructed from different metals or other suitable materials. For example, the upper portion 15a is formed from brass, which has a high hardness, and the lower portion 15b is formed from purple copper (or red copper), which has a high thermal conductivity. Conventional methods such as brazing or welding are typical techniques for connecting the two portions 15a, 15b together.

Figure 6:
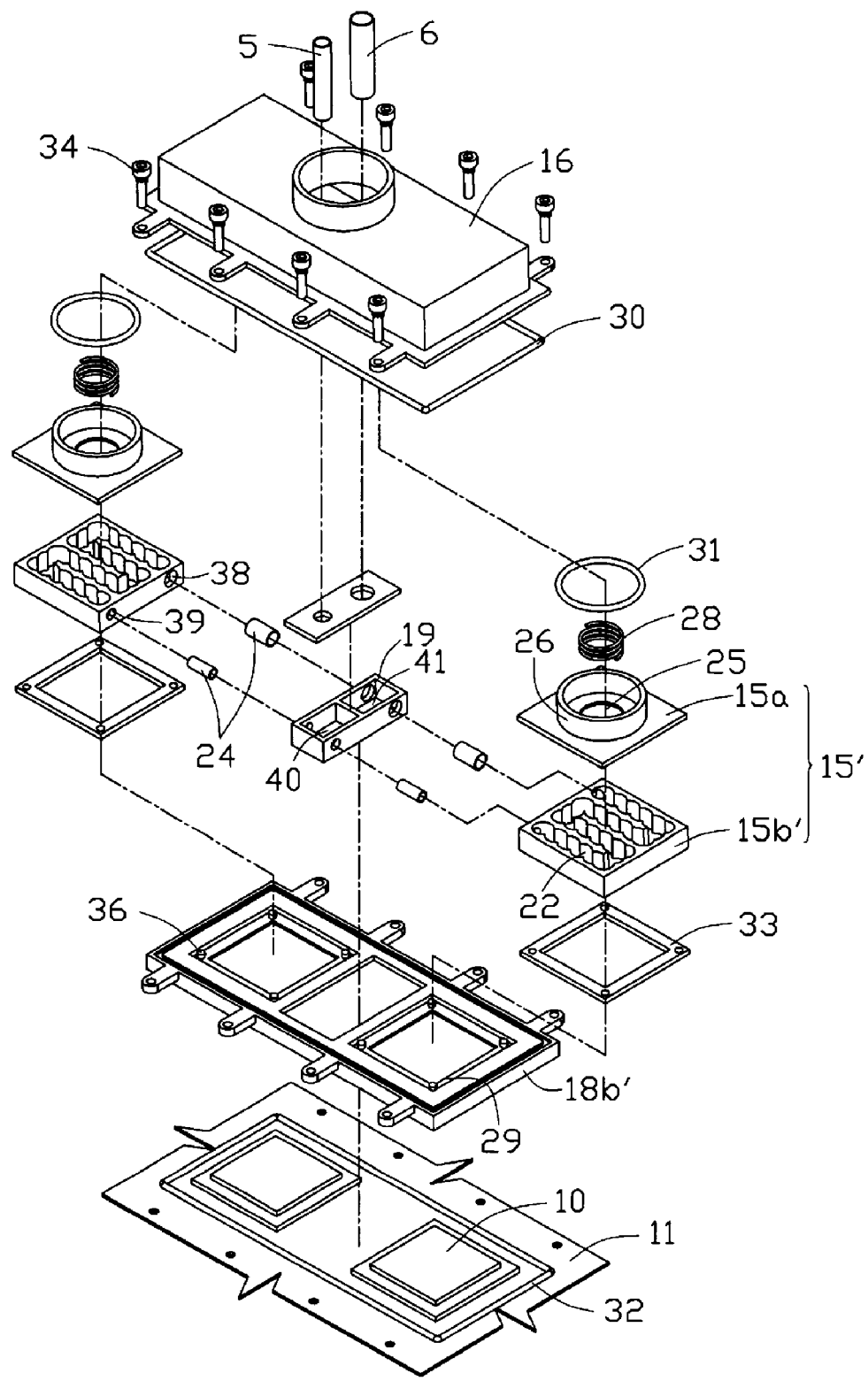
FIG. 6 is an exploded, isometric view of a cooling device in accordance with an alternative embodiment of the present invention.
Figure 7:
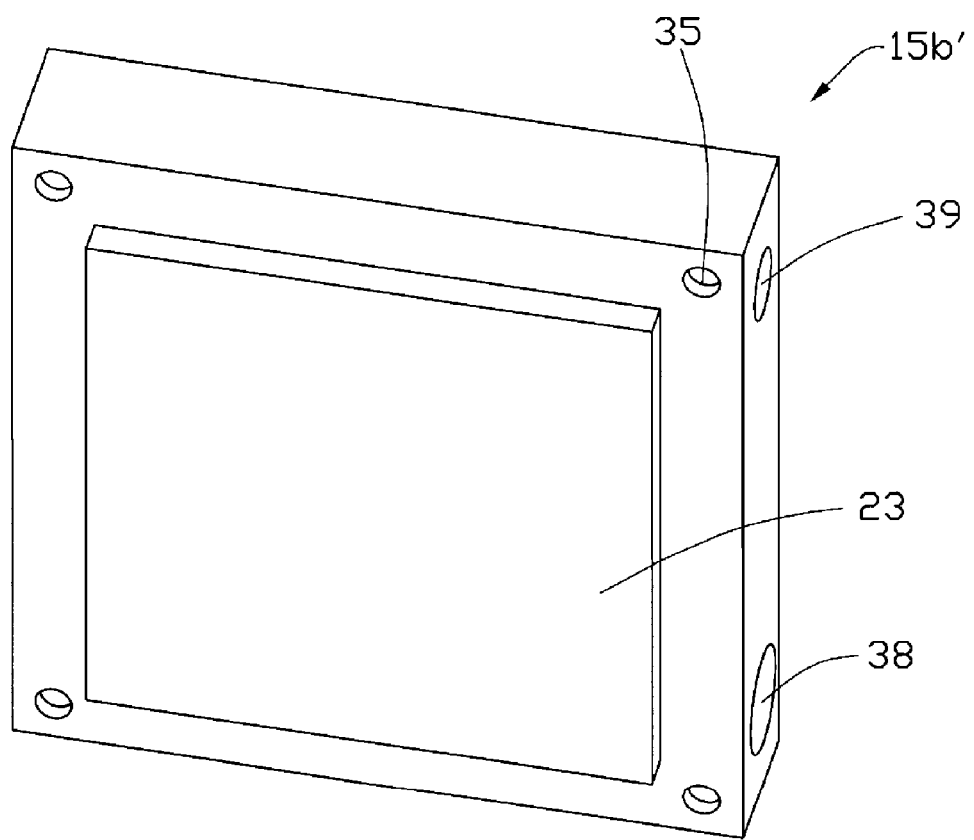
FIG. 7 is an isometric view of a lower portion of a cooling member of the cooling device of FIG. 6.
Figure 8:
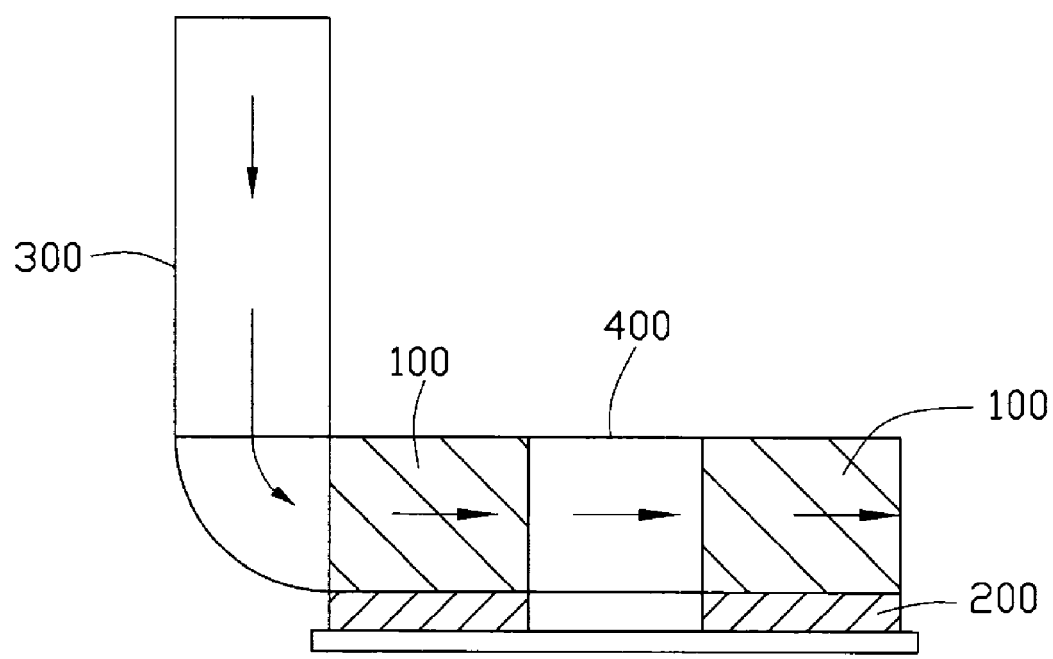
FIG. 8 is a diagrammatic, partially cross-sectional view of a cooling device in accordance with the conventional art.
Figure 9:
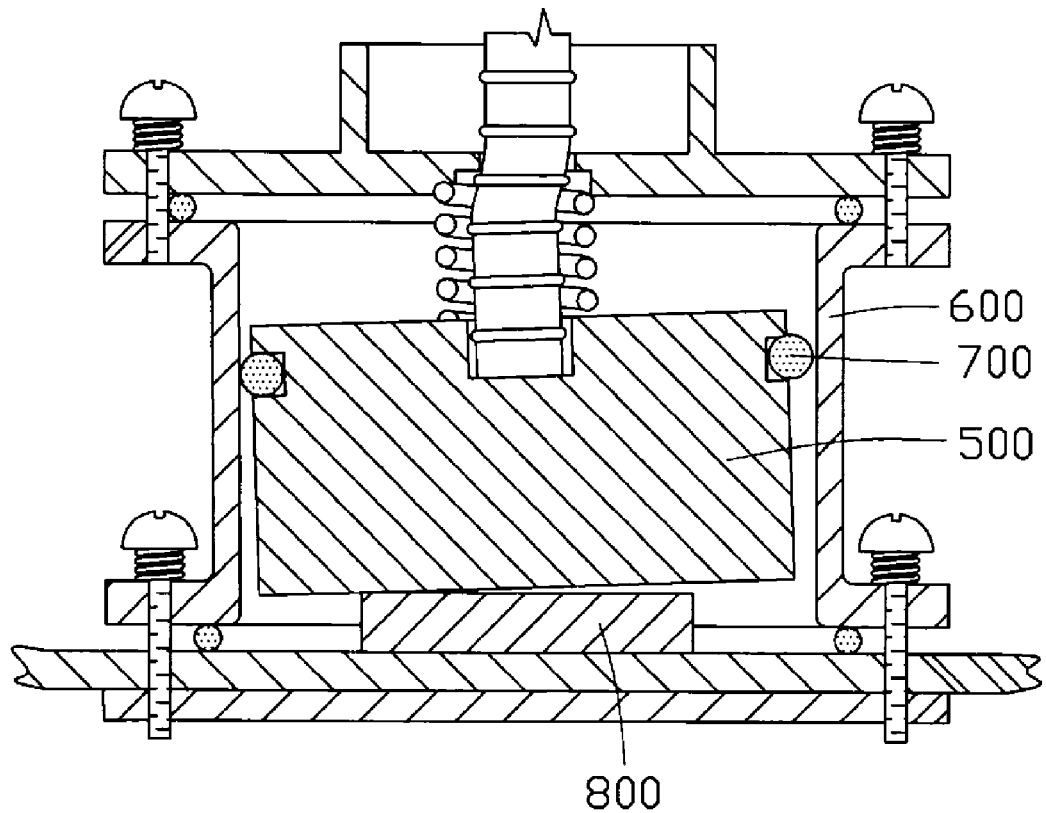
FIG. 9 is a diagrammatic, cross-sectional view showing an evaporator of a refrigeration system for cooling a CPU.

FIGS. 6-7 show an alternative embodiment of the cooling device of the present invention. The partition plate 18b' thereof has four positioning posts 36 extending upwardly from four corners of each of the rectangular recesses 29. Correspondingly, the bottom portion 15b' of each of the cooling members 15' defines four positioning holes 35 at an underside thereof for receiving these positioning posts 36, to thereby maintain each of the cooling members 15' in good alignment with the corresponding CPU 10.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A cooling device for removing heat from multiple heat-generating components comprising:
    an evaporator including multiple cooling members, the cooling members adapted to thermally contacting the multiple heat-generating components, respectively; each of the cooling members defining therein a fluid flow channel having passage of a refrigerant fluid, the refrigerant fluid being capable of turning into vapor in the cooling members upon receiving the heat;
    a condenser; a vapor conduit and a liquid conduit each being connected between the cooling members and the condenser, wherein the vapor is capable of being transferred via the vapor conduit to the condenser and turning into condensate in the condenser upon releasing the heat, and the condensate is capable of being transferred via the liquid conduit to the cooling members; and a diffluent member contained in the evaporator, the diffluent member defining therein two isolated first and second housings, the first housing being in fluid communication with the liquid conduit and an inlet of the fluid flow channel of each of the cooling members for dividing the condensate from the first housing into the fluid flow channels of the cooling members, the second housing being in fluid communication with the vapor conduit and an outlet of the fluid flow channel of each of the cooling members.

2. The cooling device of claim 1, wherein each of the cooling members includes a lower portion and an upper portion connected to the lower portion, and the fluid flow channel is formed at the lower portion.

3. The cooling device of claim 2, wherein the evaporator includes a clamping mechanism for mounting the cooling members to the multiple heat-generating components.

4. The cooling device of claim 3, wherein the clamping mechanism includes a top cover and a bottom partition plate, the top cover and the bottom partition plate cooperate with each other to define a first chamber, and the cooling members are contained in the first chamber.

5. The cooling device of claim 4, wherein the top cover defines therein a receiving groove, the upper portion of each of the cooling members has an abutting wall extending therefrom and the abutting wall engages with the top cover in the receiving groove.

6. The cooling device of claim 5, wherein the abutting wall and the receiving groove each have an annular configuration.

7. The cooling device of claim 4, wherein an elastic member is compressed and located between the upper portion of each of the cooling members and the top cover of the clamping mechanism.

8. The cooling device of claim 4, wherein the partition plate has a plurality of positioning posts formed thereon and the lower portion of each of the cooling members defines a plurality of positioning holes for receiving the positioning posts.

9. The cooling device of claim 4, wherein the heat-generating components are integrated circuit chips mounted on a circuit board, the circuit board cooperates with the partition plate of the clamping mechanism to define a second chamber between the partition plate and the circuit board, and the integrated circuit chips are located at the second chamber.

10. The cooling device of claim 9, wherein an outer circumferential portion of each of the cooling members abuts against the partition plate of the clamping mechanism and said first chamber is isolated from said second chamber.

11. The cooling device of claim 1, wherein the fluid flow channel has a corrugated inner surface.

12. A cooling device for removing heat from at least two heat-generating components comprising:
    an evaporator defining therein a first chamber and a second chamber, the evaporator including at least two cooling members located at the first chamber, the second chamber adapted to receive said at least two heat-generating components therein, the at least two cooling members adapted to thermally contacting said at least
    two heat-generating components, respectively; each cooling member defining therein a fluid flow channel for passage of a refrigerant fluid; and
    vapor and liquid conduits located outside the evaporator and being in fluid communication with the fluid flow channel of the each cooling member;
    wherein the evaporator includes a clamping mechanism for mounting the at least two cooling members to the at least two heat-generating components mounted on a circuit board, the clamping mechanism includes a top cover and a bottom partition plate cooperating with each other to define said first chamber, the circuit board cooperates with the bottom partition plate to define said second chamber therebetween, an outer circumferential portion of each of the cooling members abuts against the partition plate of the clamping mechanism, and said first chamber is isolated from said second chamber.

13. The cooling device of claim 12, wherein urging means are provided in the first chamber to urge the at least two cooling members towards the at least two heat-generating components.

14. The cooling device of claim 12, further comprising a diffluent member located within the first chamber and being in fluid communication with the fluid flow channels of the at least two cooling members.

15. The cooling device of claim 14, wherein the diffluent member defines therein two independent housings, and the two housings are in fluid communication with the liquid conduit and the vapor conduit, respectively.

16. A cooling device comprising:
    an evaporator having first chamber and second chamber hermetically isolated from each other;
    a cooling member received in the first chamber, the cooling member including upper and lower portions connected together;
    a heat generating electronic member received in the second chamber and in thermal contact with the cooling member;
    an elastic member compressed between the cooling member and a top wall of the evaporator for urging the cooling member toward the heat generating electronic member; and
    an annular abutting wall extending from the upper portion of the cooling member, the top wall defining therein an annular receiving groove, the annular abutting wall engaging with the top wall in the annular receiving groove and surrounding the elastic member; wherein
    refrigerant fluid is driven to flow through the cooling member to absorb heat from the heat generating electronic member.

17. The cooling device of claim 16, wherein the refrigerant fluid is driven to flow through the lower portion.

18. The cooling device of claim 17, wherein a resilient member is provided between the annular abutting wall and the top wall of the evaporator.

19. The cooling device of claim 18, wherein the evaporator comprises a partition separating the first and second chambers, and the partition has posts engaging in the lower portion of the cooling member.

* * * * *